United States Patent
Barrenscheen et al.

(10) Patent No.: US 9,651,630 B2
(45) Date of Patent: May 16, 2017

(54) CIRCUITRY AND METHOD FOR MONITORING A POWER SUPPLY OF AN ELECTRONIC DEVICE

(71) Applicant: Infineon Technologies AG, Neubiberg (DE)

(72) Inventors: Jens Barrenscheen, Munich (DE); Roderick McConnell, Munich (DE); Peter Ossimitz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 13/944,288

(22) Filed: Jul. 17, 2013

(65) Prior Publication Data
US 2015/0022924 A1    Jan. 22, 2015

(51) Int. Cl.
| | | |
|---|---|---|
| *H02H 3/00* | (2006.01) | |
| *G01R 31/40* | (2014.01) | |
| *H02H 7/22* | (2006.01) | |
| *G01R 19/165* | (2006.01) | |
| *G06F 1/28* | (2006.01) | |

(52) U.S. Cl.
CPC ....... *G01R 31/40* (2013.01); *G01R 19/16552* (2013.01); *G06F 1/28* (2013.01); *H02H 7/22* (2013.01)

(58) Field of Classification Search
CPC .................................................. H02H 7/22
USPC .............................................. 361/86
See application file for complete search history.

(56) References Cited

U.S. PATENT DOCUMENTS

| | | | |
|---|---|---|---|
| 5,821,808 A * | 10/1998 | Fujima | 327/541 |
| 7,493,506 B2 * | 2/2009 | Balasubramanian et al. | 713/330 |
| 7,971,076 B2 | 6/2011 | Barrenscheen et al. | |
| 8,296,588 B2 * | 10/2012 | Nakano | 713/300 |
| 8,447,996 B2 * | 5/2013 | Barrenscheen et al. | 713/300 |
| 2004/0108577 A1 * | 6/2004 | Okamoto | 257/659 |
| 2006/0075266 A1 * | 4/2006 | Popescu-Stanesti et al. | 713/300 |
| 2010/0124423 A1 * | 5/2010 | Kagaya et al. | 398/182 |

* cited by examiner

*Primary Examiner* — Thienvu Tran
*Assistant Examiner* — Lucy Thomas
(74) *Attorney, Agent, or Firm* — Eschweiller & Potashnik, LLC

(57) ABSTRACT

The disclosure relates to a circuitry including a first contact connected to a power supply, a first compare unit connected to the first contact and to a first reference signal, wherein the first compare unit is configured to compare a voltage at the first contact with the first reference signal and provide a first output signal for further processing.

32 Claims, 6 Drawing Sheets

CIRCUITRY AND METHOD FOR MONITORING A POWER SUPPLY OF AN ELECTRONIC DEVICE

BACKGROUND

Embodiments of the present disclosure relate to monitoring of contacts that are connected to a power supply of an electronic device. A broken connection to the power supply is a relevant safety issue in industrial and automotive applications.

SUMMARY

A first embodiment relates to a circuitry comprising a first contact connected to a power supply, a first compare unit connected to the first contact and to a first reference signal, wherein the first compare unit is configured to compare a voltage at the first contact with the first reference signal and provide a first output signal for further processing.

A second embodiment relates to a method for monitoring a power supply of an electronic device. The method comprises determining a comparison result by comparing a voltage at a first contact that is connected to the power supply with a first reference signal, determining whether the comparison result meets a predetermined condition, and conducting a predefined action in case the comparison result meets the predetermined condition.

A third embodiment relates to a method for monitoring a power supply of an electronic device. The method comprises determining a first comparison result by comparing a voltage at a first contact that is connected to the power supply with a first reference signal, and determining a second comparison result by comparing a voltage at a second contact that is connected to the power supply with a second reference signal. The method further comprises determining whether any of the comparison results meets a predetermined condition, and conducting a predefined action in case any of the comparison results meets the predetermined condition.

A forth embodiment is directed to a system for monitoring a power supply of an electronic device, and comprises means for determining a comparison result by comparing a voltage at a first contact that is connected to the power supply with a first reference signal. The system further comprises means for determining whether the comparison result meets a predetermined condition, and means for conducting a predefined action in case the comparison result meets the predetermined condition.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
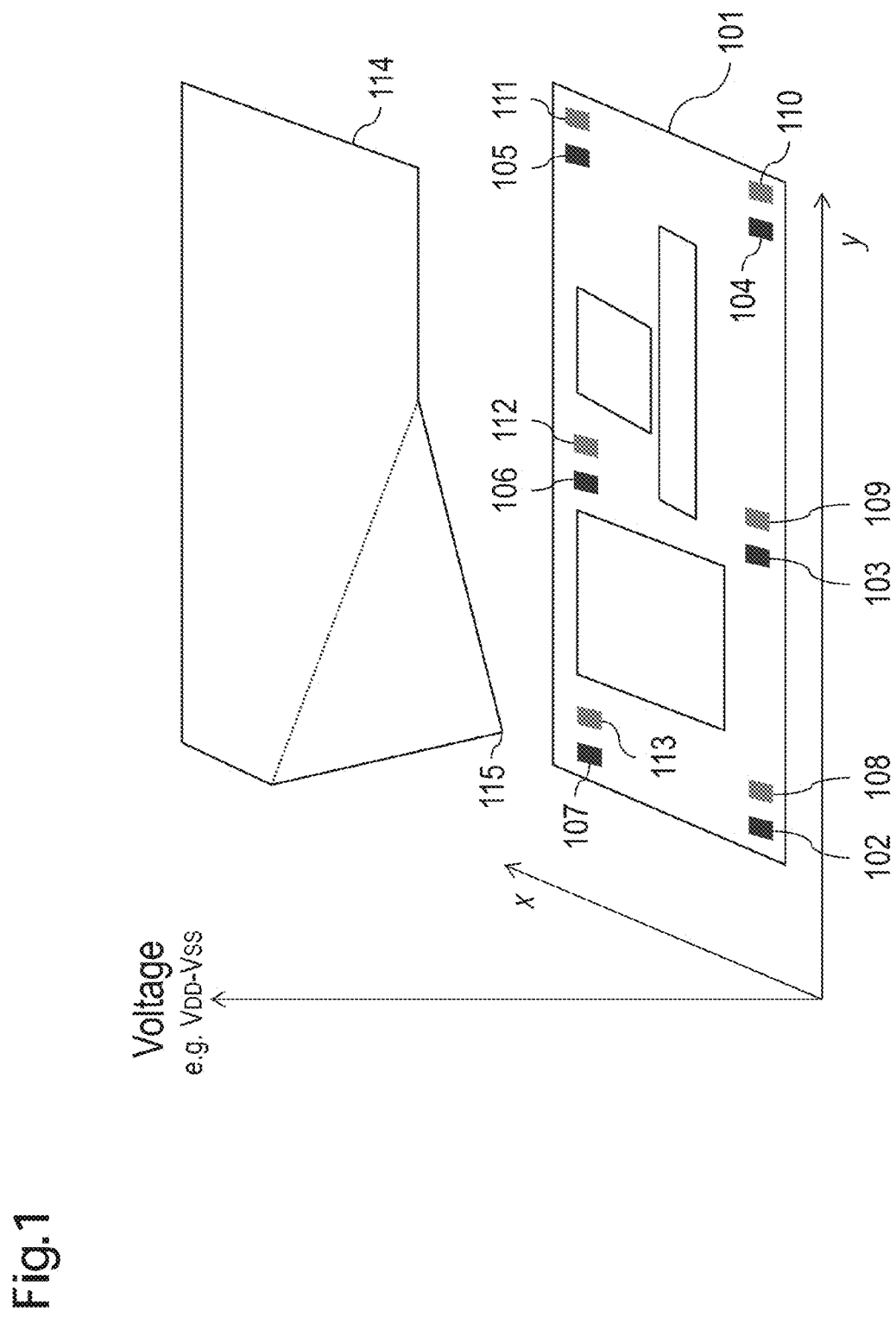
FIG. 1 shows a schematic diagram comprising a chip or a module with several chips and several pads that are connected to a power supply, wherein the pads may be subject to aging or mechanical stress.

It is noted that the contact connected to the power supply can be any contact, pad, pin or connection that is connected to (or is to be connected to) the power supply, in particular to a terminal of the power supply. The contact may be any junction between a substrate (e.g., semiconductor, a connection within one module, e.g., with a chip-to-chip interconnection) and a system in which the substrate is embedded or to which the substrate is electrically connected. Any such junction may be subject to mechanical stress and/or aging effects, and monitoring the power supplied via this contact allows determining a gradual degradation of the contact and indicating an impending failure of connection to the power supply.

It is further noted that a power supply may be any supply of electricity conveyed to a die, a chip, a module, a device, a control unit or the like. The supply power may comprise a voltage that may be used for a controller, a control unit, a bus, a chip, an electronic device, etc. The power supply may, e.g., provide a voltage amounting to a low voltage, medium voltage or high voltage range.

An example of the solution presented relates to monitoring supplied power in particular at various locations, e.g., pads or critical supply net locations. For example a voltage providing supply power can be monitored at supply pads on a substrate, e.g., a semiconductor device, a die, a chip, a module, a device, or a control unit.

Hence, the current and/or voltage arriving at such a location can be determined which allows for localized monitoring of supply power.

A junction between the substrate or semiconductor and the system may be a promising target for monitoring purposes, because such junction may have a higher probability of failure, e.g., during assembly or during operation of the system.

Examples presented herein can be used as part of package testing to verify a bonding, e.g., a valid electrical connection to the power supply. Also, testing can be conducted on the bare die to determine whether transmissions to/from the pads are accurate or within predefined limits. Monitoring and/or testing can be conducted during or after manufacture of a product. It is in particular an option to conduct monitoring and/or testing during operation, during a test-phase, during a diagnosis-phase, during a startup-phase, during a power-down-phase, or during a standby-phase of a product. The monitoring and/or testing can be triggered automatically, in particular based on a predetermined schedule (e.g., every day at 7 p.m.) or an event (e.g., a failure analysis started because of an alarm notification) and/or manually. The product may be any device, system, chip, substrate, die, control unit, etc. that can be subject to such monitoring and/or testing. The product may be a chip or part of a chip during a manufacturing process or an electronic control unit in which a chip with contacts to be tested or monitored is embedded.

Monitoring the power supply may contribute to the safety of a system or device, because an early degradation (e.g., due to aging effects) of a power connection can be determined, for example, prior to an actual broken connection. Hence, countermeasures can be initiated before an impending error occurs. One particular advantage is that the reason of the impending error can be detected, which would otherwise (after the error has occurred) be difficult and costly to diagnose and repair.

Hence, advantageously, a so-called brownout can be detected before it happens. A brownout is a drop in voltage or partial loss of power without a complete loss of power, thereby disrupting the operation of a chip, module, device or application. This can cause a critical situation, because in safety-relevant scenarios, a connection to the power supply should not be unintentionally interrupted. Such a local voltage drop can be caused, e.g., by aging of at least one interconnect or an associated supply path on the chip or package. In case a supply net comprising multiple paths in parallel is used, the supply voltage may still be available, but the supply voltage may be distributed via a reduced number of paths, e.g., bond wires: As a consequence, the current load on the remaining paths (connections) may increase, which may increase the risk of an impending break down of at least one additional path and thus a potential malfunction of the whole chip.

FIG. 1 shows a schematic diagram comprising a chip 101 or a module with several chips, e.g., (on) a substrate. The chip 101 comprises several pads 102 to 113 (also referred to as contacts or connections) to at least one power supply (not shown in FIG. 1). The pads 102 to 107 are connected to ground of the power supply and the pads 108 to 113 are connected to at least one supply voltage of the power supply. A two-dimensional curve 114 schematically shows a voltage signature with respect to the chip 101. The curve 114 indicates a voltage drop 115 at the lower left corner of the chip 101, which may be based on, e.g., an aging effect of the connection of pad 102 and/or pad 108. The curve 114 may in particular indicate any voltage, e.g. a positive (power supply) voltage (VDD) minus a negative (power supply) voltage (VSS). The curve 114 may be a result of monitoring the pads 102 to 113 over time, which allows determining a gradual degradation of the connections and thus the efficiency of the power supplied to the chip 101.

U.S. Pat. No. 7,971,076 discloses an example threshold checker, which is hereby incorporated by reference. Variations of such threshold checker or different threshold checkers can be utilized in connection with the approach presented herein.

A threshold checker can be used to determine whether a given supply voltage is below a minimum threshold or exceeds a maximum threshold over ground.

Threshold checking can be done with or without considering a time factor (integration of voltage over time, averaging, etc.). A reference value can be used for comparison purposes based on, e.g., a relative value. For example, a changed offset or reference point can be compensated for by using an average value obtained from multiple points to specify a reference value. Thus, advantageously a general change of voltage affecting the whole device or system may thus not influence the test results.

A reference value can be adjusted, e.g., during or after production or assembly of a device comprising the substrate or die, in particular when testing the semiconductor component. In addition or as an alternative, a run check can be conducted at a startup of a module, a device or a system or during normal operation (run-time). The run check may be initiated by software or by hardware, e.g., triggered by a central processor.

Alternatively, a voltage and/or a current can be measured locally between, e.g., VSS and VDD, and it can be converted into a digital value. Digital values can be transmitted easily over long distances. Also, digital values can be transmitted to and from separate semiconductor components. In addition, digital values can be easily stored for later processing, in particular for comparison purposes.

A high granularity of checking the power supply can be provided: Each connection or a selection thereof may be subject to power supply monitoring. In addition or as an alternative, groups of connections can be subject to power supply monitoring.

Monitoring can be done following a predefined rate or speed and/or sensitivity. For example, low monitoring rates and/or low sensitivity can lead to a reduced number of false alarms. For example, power surges or transients may be time-averaged by averaging means, e.g., determining mean values or levels over the values monitored. In particular, various kinds of filtering mechanisms may be applied to the values monitored in order to achieve an averaging effect, e.g., over time.

It is also an option, e.g., depending on the actual use-case scenario, to implement high monitoring speed and/or high sensitivity, which may be beneficial for detecting glitches.

As a further option, switching between different modes of monitoring (high/low mode) can be provided. In particular, the mode may be changed pursuant to a particular use-case scenario, e.g., application or configuration. It is also an option that one monitoring mode refers to a high power consumption load case and another monitoring mode reflects a low power consumption load case of, e.g., the semiconductor, die, chip or module to be monitored.

The example presented herein may be used for dynamic current monitoring, e.g., IDDQ testing. IDDQ testing is a method for testing CMOS integrated circuits for the presence of manufacturing faults. It relies on measuring the supply current (Idd) during a quiescent state (when the circuit is not switching and inputs are held at static values). The current consumed in the state is referred to as IDDQ (for "Idd Quiescent"). Details on IDDQ testing can be found under http://en.wikipedia.org/wiki/Iddq_testing.

For current monitoring purposes, a time reference may be provided, e.g., via a clock. For example, a trigger with a specific event may be used, e.g., a system startup or a particular operation or mode. As an alternative (or in addition), a diagnostic event may be utilized. Also, an AC characteristic of a power supply pad may be monitored.

Figure 2:
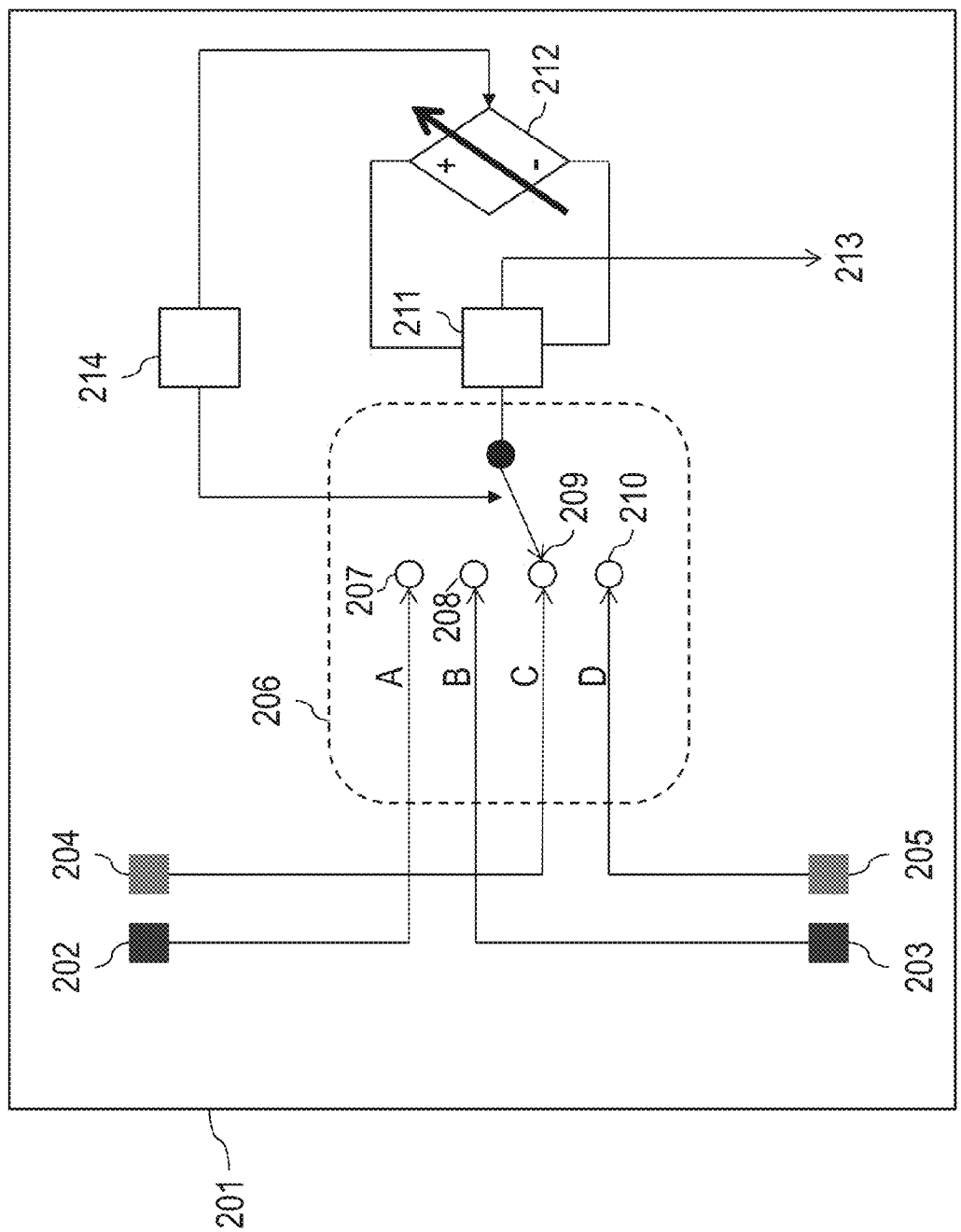
FIG. 2 shows a schematic diagram for visualizing a central compare scheme, wherein voltages at pads are compared to reference values provided via a (central) reference unit.

FIG. 2 shows a schematic diagram for visualizing a central compare scheme. FIG. 2 comprises a chip 201 with pads 202 to 205, wherein the pads 202 and 203 are connected to ground and the pads 204 and 205 are connected to a supply voltage. The chip 201 comprises an analog bus 206 with pins 207 to 210, wherein pin 207 is connected to pad 202, pin 208 is connected to pad 203, pin 209 is connected to pad 204 and pin 210 is connected to pad 205. Each of these pins 207 to 210 can be connected to a threshold checker 211, which is supplied with various reference values via a unit 212.

The connection of the pins 207 to 210 with the threshold checker 211 can be achieved via a selection means 214, which may be arranged to multiplex one of the pins 207 to 210 to the threshold checker 211. In addition, the selection means 214 may control the reference values supplied by the unit 212.

For example, the pin 207 is supplied with a voltage amounting to a value "A", which is compared via the threshold checker 211 with a reference value "A" for this pin 207. The result of the comparison is supplied via a line 213 indicating whether the voltage which should ideally correspond to the value "A" at the pin 207 and the reference value "A" are identical, similar or differ from each other by more than a predefined amount. Also, the information provided via the line 213 may indicate a value of the difference between the voltage at the pin 207 and the reference value "A".

Subsequently, the pin 208 is selected and the voltage at the pin 208, which should correspond to a value "B", is compared with a reference value "B" supplied by the unit 212. The result of this comparison is also supplied by the line 213. Accordingly, the pins 209 and 210 are selected and their voltage values "C" and "D" are compared to reference values "C" (for pin 209) and "D" (for pin 210). The results of the comparisons can be detected at the line 213.

The line 213 may thus indicate in a successive order whether the voltage at any of the pins 207 to 210 corresponds to its (predefined) reference value or whether it differs from its reference value. The unit 212 may provide different reference values for each comparison conducted by the threshold checker 211. Hence, via the line 213 it can be determined when any voltage at the pins 207 to 210 deviates from its corresponding reference value (supplied by the unit 212). As a result, aging effects can be detected prior to an actual defect and countermeasures can be initiated prior to any malfunction on the chip 201.

The threshold checker 211 can be implemented comprising at least one compare unit. As an alternative, the threshold checker 211 may be implemented as or based on the unit as described in U.S. Pat. No. 7,971,076 B2, which is hereby incorporated by reference.

One example of an implementation of the threshold checker 211 may comprise a first-stage compare unit determining a difference between the voltage at one of the pins 207 to 210 and its associated reference value "A" to "D" supplied via the unit 212. A second-stage compare unit may compare the outcome of the first-stage compare unit with a threshold reference value indicating whether the difference determined by the first-stage compare unit is within a predefined limit or outside said limit. An output of the second-stage compare unit is supplied via the line 213, indicating via a first value that the comparison with the threshold reference is within the limit and via a second value that the comparison exceeded the threshold reference value and is therefore considered outside the predefined limit.

It is an option that the voltages at the pins 207 to 210 are compared to a voltage provided via a reference point, e.g., a reference measurement conducted on the chip 201 or elsewhere in a module. In such scenario, the unit 212 may be omitted.

Figure 3:
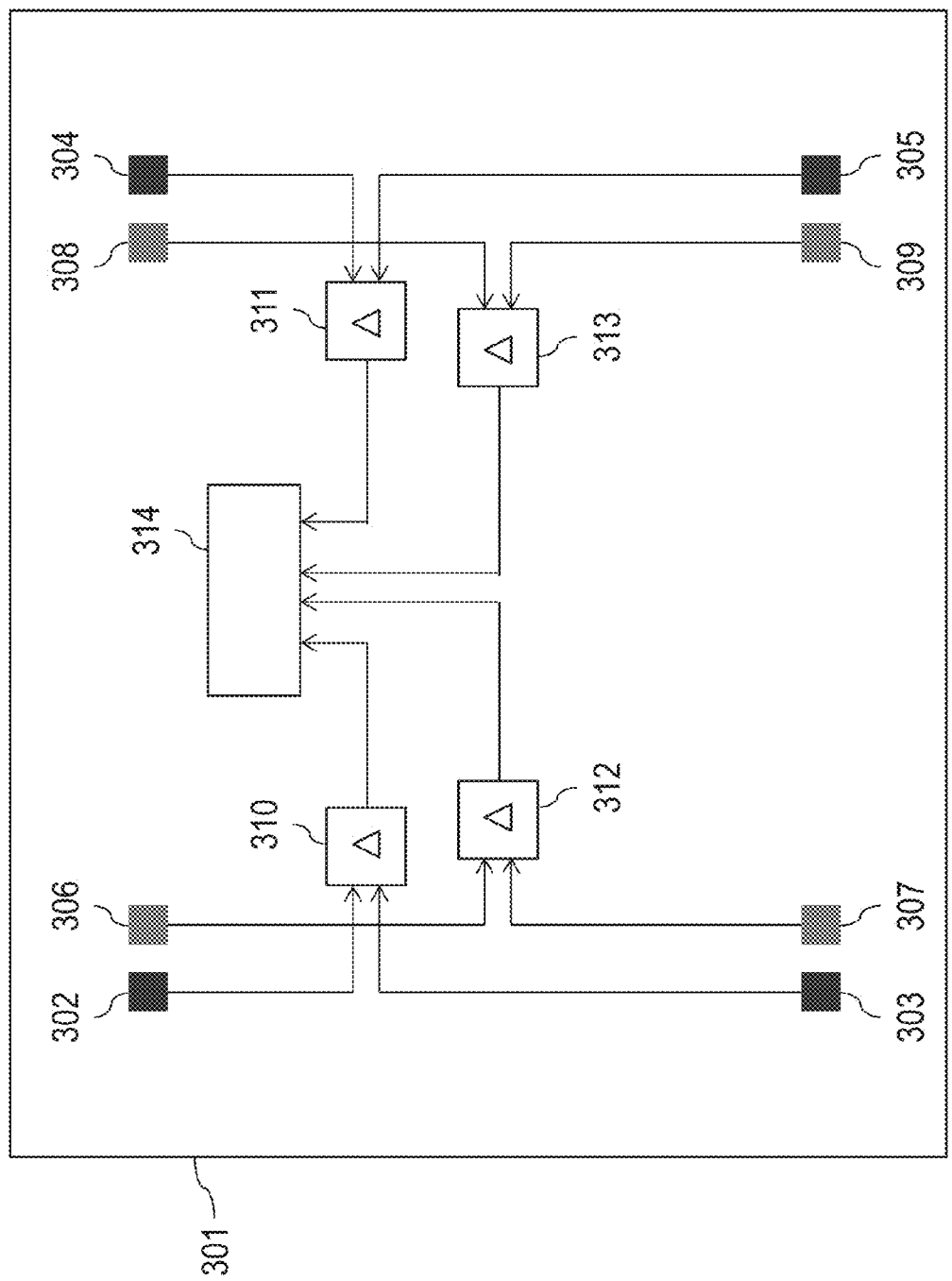
FIG. 3 shows a schematic diagram of a decentralized (distributed) compare scheme, wherein signals applied to several pads are compared such that two pads of presumably equal voltage are compared with each other.

FIG. 3 shows a schematic diagram of a decentralized (distributed) compare scheme. A chip 301 comprises pads 302 to 309, four compare means 310 to 313 and a memory 314 (which may be implemented as an error latch). Each compare means 310 to 313 comprises two inputs and an output, wherein the values applied to the inputs are compared with each other and the result of such comparison is supplied via the output. The compare means 310 to 313 may be realized as a compare unit, in particular comprising at least one operational amplifier.

The pads 302 and 303 are connected to the compare means 310, the pads 304 and 305 are connected to the compare means 311, the pads 306 and 307 are connected to the compare means 312 and the pads 308 and 309 are connected to the compare means 313. The output of each of the compare means 310 to 313 is connected to the memory 314. Hence, the results of the comparisons conducted by the compare means 310 to 313 can be stored in the memory 314, which may for each of the compare means indicate a deviation regarding, e.g., a voltage value between the two pads that are connected to the same compare means.

Such deviation can be further processed, e.g., compared with a threshold value. If the threshold is exceeded, the voltage difference between two pads compared is deemed too high and at least one of the following countermeasures can be triggered: an alarm or fault indication can be generated, it can be switched to an auxiliary system, the operation can be transferred into a safe state, the device can be switched off or a standby mode can be entered.

The example shown in FIG. 3 enables comparing voltages of presumably equal potential at different locations of a chip or a module with each other. This approach has the advantage that deviations from similar voltage values can be detected independently from the actual amount of supply voltage applied to the chip.

Figure 4:
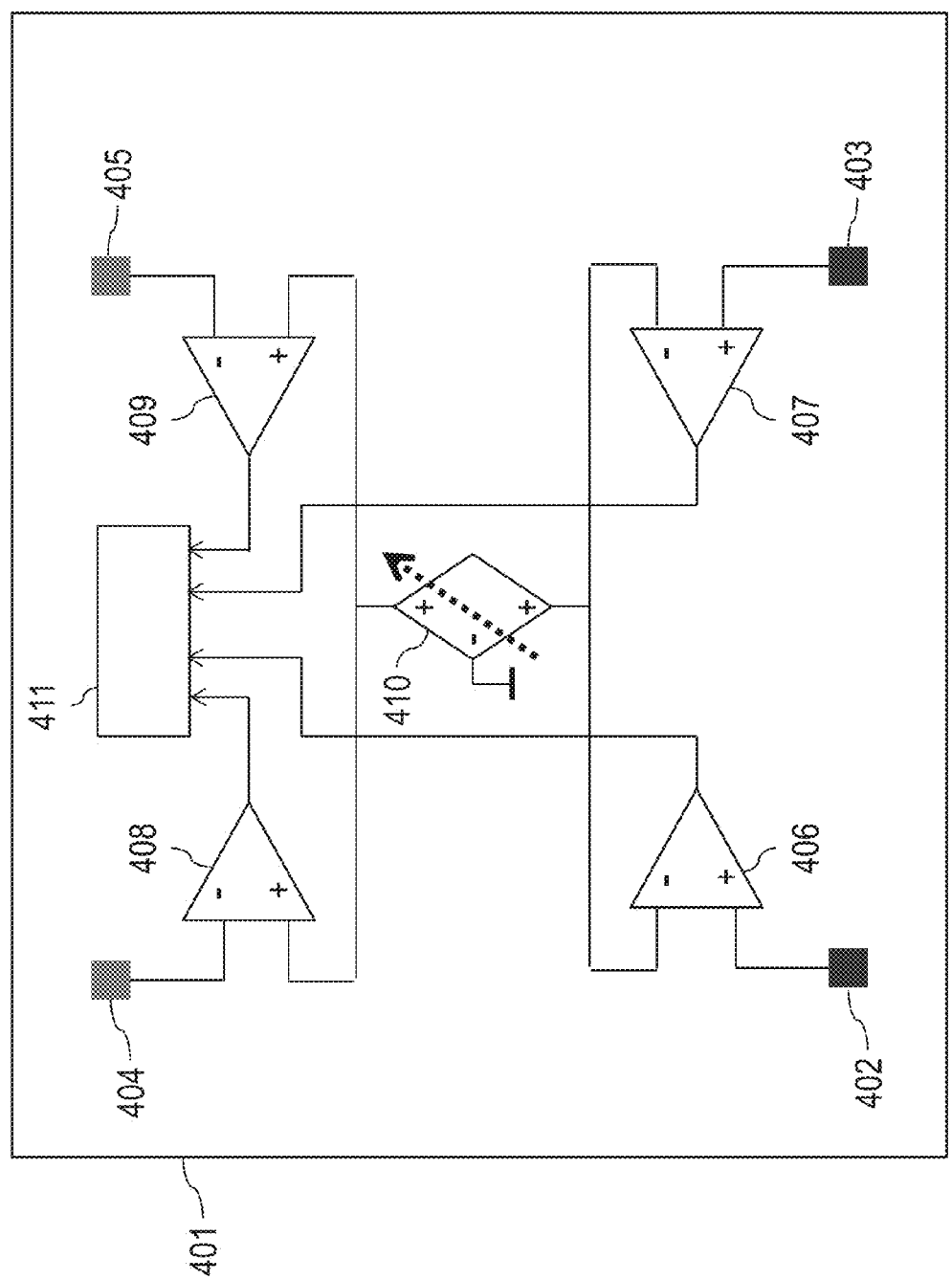
FIG. 4 shows a schematic diagram of a decentralized (distributed) compare scheme utilizing a central reference.

FIG. 4 shows a schematic diagram of a decentralized (distributed) compare scheme utilizing a central reference.

A chip 401 comprises pads 402 to 405, four compare means 406 to 409, a reference unit 410 supplying two reference outputs (providing a first and second reference value) and a memory 411 (which may be implemented as an error latch). In one embodiment the reference unit 410 can be adjustable (indicated by the dotted arrow in FIG. 4) or it can provide fixed reference values. The compare means 406 to 409 can be realized as operational amplifiers, in particular compare units with a positive and a negative input and an output.

The pad 402 is connected to the positive input of the compare means 406 and the pad 403 is connected to the positive input of the compare means 407. The pad 404 is connected to the negative input of the compare means 408 and the pad 405 is connected to the negative input of the compare means 409. The negative input of the compare means 406 is connected to the negative input of the compare means 407 and to the negative input of the reference unit 410. The positive input of the compare means 408 is connected to the positive input of the compare means 409 and to the positive input of the reference unit 410. The outputs of the compare means 406 to 409 are connected to the memory 411.

The compare means 408 activates its output in case the voltage at the pad 404 drops below the first reference value supplied by the reference unit 410. Accordingly, the compare means 409 activates its output in case the voltage at the pad 405 drops below the first reference value supplied by the reference unit 410. This allows detecting a voltage shortage at a pad 404, 405 that is connected to the positive (power supply) voltage.

On the other hand, the compare means 406, 407 indicate that the voltage at the pads 402 or 403 exceeds the second reference value. This allows detecting a ground-shift in case the pads 402, 403 are connected to ground.

This approach allows comparing voltages at the pads 402 and 403 with each other and comparing voltages at the pads 404 and 405 with each other, wherein the voltages at the pads 402 and 403 have a predefined voltage difference over the voltages at the pads 404 and 405, said difference being determined by the reference unit 410. Hence, a central reference voltage supplied by the reference unit 410 is utilized as an example for distributed comparisons. Advantageously, the reference unit 410 may provide a relative voltage difference, e.g., VDD or VSS over ground.

The central reference is in particular useful in applications or scenarios with short distances to the central reference unit.

Figure 5:
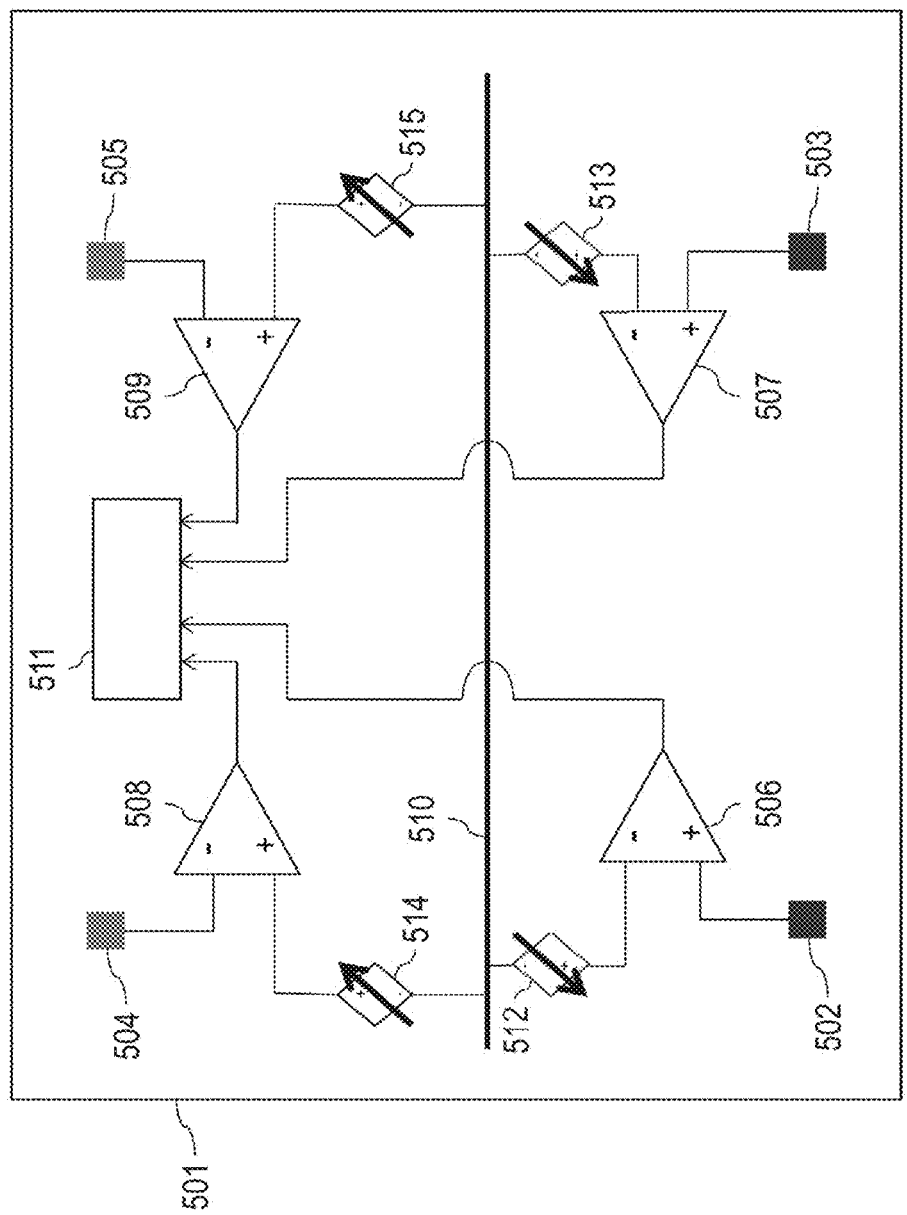
FIG. 5 shows a schematic diagram of a decentralized (distributed) compare scheme utilizing distributed references.

FIG. 5 shows a schematic diagram of a decentralized (distributed) compare scheme utilizing distributed references.

A chip 501 comprises pads 502 to 505, four compare means 506 to 509, four reference units 512 to 515, a shared reference 510 (which may be a shared reference line supplying a reference voltage) and a memory 511 (which may be implemented as an error latch). The reference units 512 to 515 can be adjustable or provide a fixed reference value. The compare means 506 to 509 can be realized as operational amplifiers, in particular compare units with a positive and a negative input and an output.

The pad 502 is connected to the positive input of the compare means 506 and the pad 503 is connected to the positive input of the compare means 507. The pad 504 is connected to the negative input of the compare means 508 and the pad 505 is connected to the negative input of the compare means 509.

The negative input of the compare means 506 is connected via the reference unit 512 to the shared reference 510, the negative input of the compare means 507 is connected via the reference unit 513 to the shared reference 510, the positive input of the compare means 508 is connected via the reference unit 514 to the shared reference 510 and the positive input of the compare means 509 is connected via the reference unit 515 to the shared reference 510. The outputs of the compare means 506 to 509 are connected to the memory 511.

In contrast to the example of FIG. 4, FIG. 5 utilizes several reference units 512 to 515, each for one of the compare means 506 to 509 to individually adjust reference voltages with regard to a common shared reference 510. Hence, each pad 502 to 505 can be compared with a different reference voltage or, in other words, at each pad 502 to 505 the reference voltage can be individually adjusted. This allows for a high degree of flexibility. It is also an advantage that the shared reference 510 may serve as a flexible basis (common reference) for adjusting the reference units 512 to 515. Hence, this approach may beneficially work with different absolute values of supply voltages, because it flexibly adjusts the reference voltages based on the voltage provided via the shared reference 510.

Advantageously, the distributed reference units 512 to 515 in combination with the compare means 506 to 509 enable larger distances between pads without experiencing a significant amount of noise that may otherwise falsify the measurement results.

Figure 6:
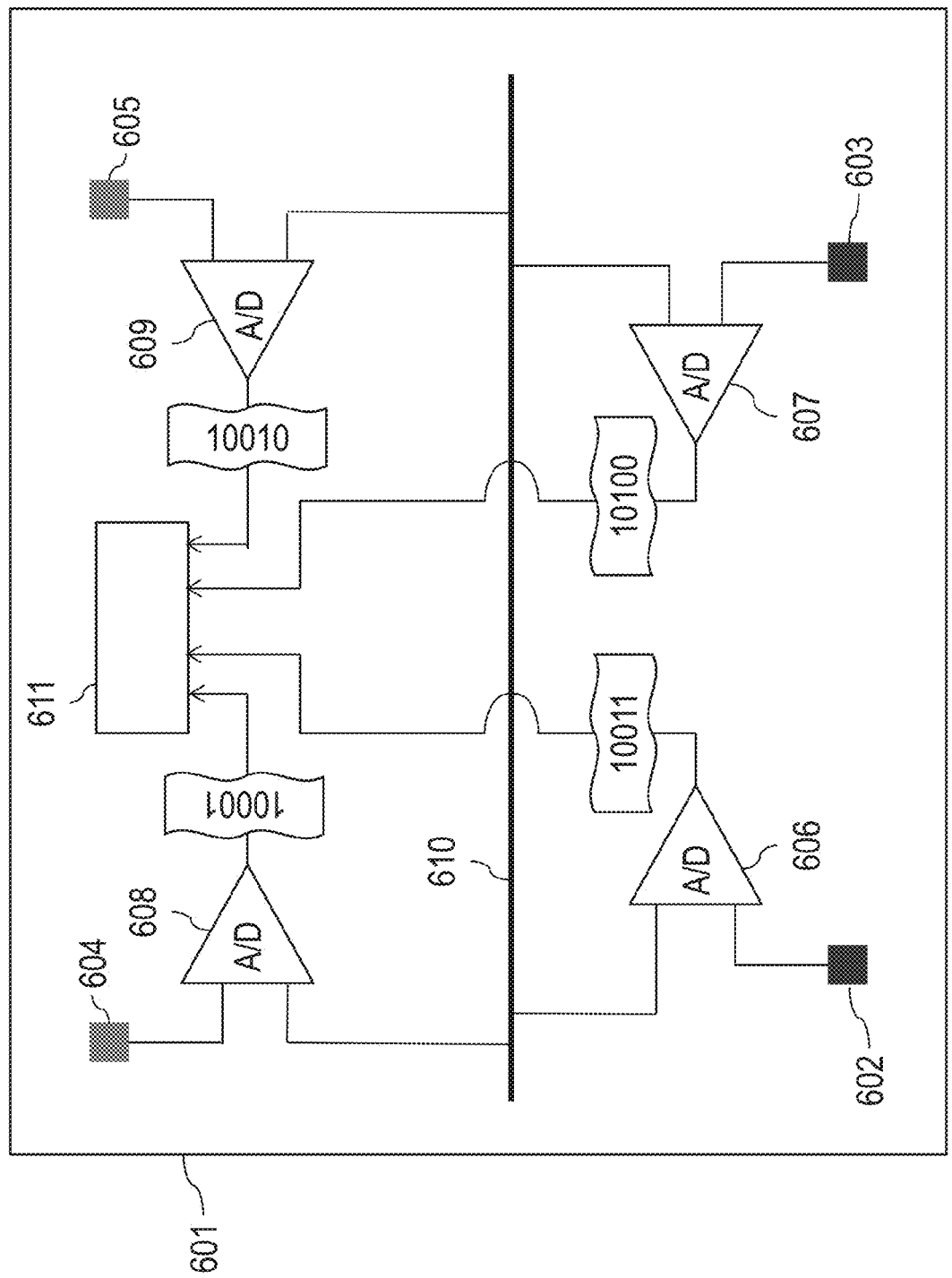
FIG. 6 shows a schematic diagram of a front-end utilizing analog-to-digital converters that allow for processing digital data.

FIG. 6 shows a schematic diagram of a front-end utilizing analog-to-digital converters that enable digital data processing. This approach can be combined with any of the examples described above.

A chip 601 comprises pads 602 to 605, four compare means (e.g., compare units comprising a positive input, a negative input and an output) with analog-to-digital converters 606 to 609 (hereinafter referred to as compare means 606 to 609), each providing a digital output indicated by a sequence of "0" and "1", a shared reference 610 (which may be a shared reference line supplying a reference voltage) and a memory 611 (which may be implemented as an error latch).

The pad 602 is connected to the measurement input of the compare means 606 and the pad 603 is connected to the measurement input of the compare means 607. The pad 604 is connected to the measurement input of the compare means 608 and the pad 605 is connected to the measurement input of the compare means 609. The reference input of the compare means 606 and the reference input of the compare means 607 are connected to the shared reference 610. The reference input of the compare means 608 and the reference input of the compare means 609 are connected to the shared reference 610. The outputs of the compare means 606 to 609 are connected to the memory 611.

Hence, the arrangement shown in FIG. 6 can be deemed based on FIG. 5 without the local reference units between the shared reference 610 and the compare means 606 to 609. However, as an option, such local reference units as shown in FIG. 5 can be provided in FIG. 6 as well.

The compare means 606 to 609 may supply digital values indicating the difference of the voltage at the respective pad 602 to 605 in view of the voltage supplied via the shared reference 610. Each of such difference may be stored in the memory 611 and may be subject to further processing. For example, gradual changes over time can be determined in order to detect an impending malfunction on the chip, e.g., due to a deteriorating connection between the pad and the power supply. Each of the compare means 606 to 609 could be realized as an analog-to-digital converter comprising a measurement input and a reference input and supplying a digital value representing the difference between both inputs at its output.

During manufacturing of a device, chip, module or the like, in-package connections to a power supply can be verified in an efficient manner. This can be done, e.g., after bonding of the wires and/or after flip-chip mounting (e.g., after soldering). The verification may comprise determining gradual deteriorations as well as defective (incomplete) connections.

Also, connections to the power supply can be verified after a printed circuit board is assembled, after a device (e.g., an electronic control unit) is assembled and/or after installation of an end product.

This provides a highly flexible approach for determining whether connections to the power supply are flawless during manufacturing of a chip, module or device or after that. The solution is in particular useful when being applied to chip-on-board scenarios: Power supply connections can be monitored, verified before or after the chip is mounted.

It is another advantage that the solution suggested allows detection of an inaccurate assembly of a device or board. Hence, the approach can be used for testing purposes after an assembly process of a chip, board or device.

Also, online testing or monitoring can be used to determine aging effects of the chip or device. Hence, power supply connections can be verified or assessed during operation of a product. Such testing can be done, e.g., at regular or irregular intervals, discontinuously, continuously, or any combination thereof.

Monitoring can be used for early fail indication purposes. For example, if a deterioration of a connection is indicated, a preventive maintenance measure can be recommended or triggered prior to an actual failure. Hence, a long-term reliability can be achieved and failures due to defective power supply connections can be avoided or at least be significantly reduced. This is in particular useful in industrial applications.

The monitoring can be utilized over time by storing monitored values and determining any change or deterioration thereof. For example, a gradual change of a decreasing voltage value can be extrapolated based on a history of monitored values thereby indicated when a failure is likely to occur and/or when a maintenance measure should be triggered in order to avoid such failure. Monitoring is in particular beneficial when applied in the digital domain, i.e. storing and processing digital values that may be provided by an analog-to-digital frontend as described above.

It is noted, however, that the conversion into digital values, e.g., for monitoring purposes, can be done at various stages of the solution provided. For example, such conversion into the digital domain can be done in a centralized or in a decentralized fashion.

The solution presented herein may in particular contribute to fulfilling safety standard requirements, such as, e.g., Automotive Software Integrity Level (ASIL) requirements.

At least one of the following examples and/or embodiments may be considered innovative. They might be combined with other aspects or embodiments as described. Any embodiment or design described herein is not necessarily to be construed as preferred or advantageous over other embodiments or designs.

A circuitry is suggested that comprises a first contact connected to a power supply, and a first compare unit connected to the first contact and to a first reference signal. The first compare unit is configured to compare a voltage at the first contact with the first reference signal and provide a first output signal for further processing based thereon.

In an embodiment, the first output signal indicates a difference between the voltage at the first contact and the first reference signal.

In an embodiment, the circuitry comprises a reference unit providing the first reference signal.

In an embodiment, the circuitry comprises a shared reference potential to which the reference unit is connected.

In an embodiment, the circuitry comprises a second contact providing the first reference signal.

In an embodiment, the circuitry comprises a second contact connected to the power supply, and a second compare unit connected to the second contact and to the first reference signal. The second compare unit is configured to compare a voltage at the second contact with the first reference signal and providing a second output signal for further processing based thereon.

In an embodiment, the circuitry comprises a third contact connected to the power supply, and a third compare unit connected to the third contact and to a second reference signal. The third compare unit is configured to comparing a voltage at the third contact with the second reference signal and providing a third output signal for further processing based thereon. The circuitry also comprises a forth contact connected to the power supply, and a fourth compare unit connected to the forth contact and to the second reference signal. The fourth compare unit is configured to compare a voltage at the forth contact with the second reference signal and provide a forth output signal for further processing based thereon. The circuitry further comprises a reference unit configured to provide the first reference signal and the second reference signal.

In an embodiment, the first contact and the second contact are connected to a first terminal of the power supply and the third contact and the fourth contact are connected to a second terminal of the power supply.

In an embodiment, the circuitry comprises memory configured to store at least one of the first output signal, the second output signal, the third output signal and the fourth output signal.

In an embodiment, the reference unit is an adjustable reference unit.

In an embodiment, the first to fourth compare unit each comprise at least one of the following: an operational amplifier, a compare unit, and an analog-to-digital converter.

In an embodiment, the circuitry is at least one of the following: a substrate, a die, a chip, a module, a device, and a control unit.

In an embodiment, the circuitry comprises a processing unit configured to conduct the further processing, wherein the further processing comprises at least one of the following: issuing a notification, issuing an alarm, issuing a maintenance measure, changing a mode of the circuitry, and shutting down the circuitry or a portion thereof.

A method for monitoring a power supply of an electronic device is suggested, and comprises (a) determining a comparison result by comparing a voltage at a first contact that is connected to the power supply with a first reference signal. The method further comprises (b) determining whether the comparison result meets a predetermined condition, and (c) conducting a predefined action in case the comparison result meets the predetermined condition.

In an embodiment, the method further comprises (d) continuing with act (a) if the comparison result does not meet the predetermined condition.

In an embodiment, the predetermined condition comprises at least one of the following: exceeding a predefined threshold, falling below a predefined threshold, and exceeding or falling short of a predefined threshold range.

In an embodiment, the predefined action comprises at least one of the following: issuing a notification, issuing an alarm, issuing a maintenance measure, changing a mode of the circuitry, and shutting down the device or a portion thereof.

In an embodiment, the predefined action comprises changing a monitoring mode.

In an embodiment, the monitoring mode comprises at least one of the following parameters: a monitoring rate, a monitoring sensitivity, and an averaging parameter.

In an embodiment, the monitoring rate indicates that monitoring is done in an iterative, regular, irregular, continuous or discontinuous way.

In an embodiment, the first reference signal is supplied by at least one of the following: a reference unit, an adjustable reference unit, a shared reference potential, and a second contact.

In an embodiment, the method is run at least once during at least one of the following stages: during a manufacturing process of a semiconductor of the electronic device, during a manufacturing process of a semiconductor of the electronic device before or after a stress injection like a burn in, during a manufacturing process of a semiconductor of the electronic device before and after a stress injection like a burn in, during operation of the electronic device, in regular or non-regular cycles during operation of the electronic device, during a system level test of the electronic device, and during a system level test as part of a power down sequence of the electronic device.

A method for monitoring a power supply of an electronic device is suggested, comprising (a) determining a first comparison result by comparing a voltage at a first contact that is connected to the power supply with a first reference signal, and (b) determining a second comparison result by comparing a voltage at a second contact that is connected to the power supply with a second reference signal. The method further comprises (e) determining whether any of the comparison results meets a predetermined condition, and (f) conducting a predefined action in case any of the comparison results meets the predetermined condition.

In an embodiment, the first reference signal and the second reference signal are identical.

In an embodiment, the first reference signal and the second reference signal are provided by at least one of the following: a reference unit, an adjustable reference unit, and a shared reference potential.

In an embodiment, the method comprises the following steps prior to conducting act (e): (c) determining a third comparison result by comparing a voltage at a third contact that is connected to the power supply with a third reference signal, and (d) determining a fourth comparison result by comparing a voltage at a fourth contact that is connected to the power supply with a fourth reference signal.

In an embodiment, the first contact and the second contact are connected to a first terminal of the power supply and the third contact and the fourth contact are connected to a second terminal of the power supply.

In an embodiment, the third reference signal and the fourth reference signal are identical.

In an embodiment, the third reference signal and the fourth reference signal are provided by at least one of the following: a reference unit, an adjustable reference unit, and a shared reference potential.

A system for monitoring a power supply of an electronic device is provided, comprising a means for determining a comparison result by comparing a voltage at a first contact that is connected to the power supply with a first reference signal. The system further comprises means for determining whether the comparison result meets a predetermined condition, and means for conducting a predefined action in case the comparison result meets the predetermined condition.

In an embodiment, the system comprises means for continuing determining a subsequent comparison result in case the comparison result does not meet the predetermined condition.

In an embodiment, the first reference signal is provided by at least one of the following: a reference unit, an adjustable reference unit, a shared reference potential, and a second contact.

Although various exemplary embodiments of the disclosure have been disclosed, it will be apparent to those skilled in the art that various changes and modifications can be made which will achieve some of the advantages of the disclosure without departing from the spirit and scope of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A circuitry, comprising:
   a first contact connected to a power supply, wherein the first contact is a junction between a substrate and a system in which the substrate is embedded or to which the substrate is electrically connected; and
   a first compare unit connected to the first contact and to a first reference signal, and configured to compare a gradual change of a voltage at the first contact over time with the first reference signal and provide a first output signal for further processing based thereon,
   wherein the gradual change of the voltage is extrapolated based on a history of monitored voltage values.

2. The circuitry according to claim 1, wherein the first output signal indicates a difference between the voltage at the first contact and the first reference signal.

3. The circuitry according to claim 1, further comprising a reference unit configured to provide the first reference signal.

4. The circuitry according to claim 3, further comprising a shared reference potential to which the reference unit is connected.

5. The circuitry according to claim 1, further comprising a second contact configured to provide the first reference signal, wherein the second contact is a junction between the substrate and the system in which the substrate is embedded or to which the substrate is electrically connected.

6. The circuitry according to claim 1, further comprising:
   a second contact connected to the power supply, wherein the second contact is a junction between the substrate and the system in which the substrate is embedded or to which the substrate is electrically connected; and
   a second compare unit connected to the second contact and to the first reference signal, and configured to compare a gradual change of a voltage at the second contact over time with the first reference signal and provide a second output signal for further processing based thereon.

7. The circuitry according to claim 6, further comprising:
   a third contact connected to the power supply, wherein the third contact is a junction between the substrate and the system in which the substrate is embedded or to which the substrate is electrically connected;
   a third compare unit connected to the third contact and to a second reference signal, and configured to compare a gradual change of a voltage at the third contact over time with the second reference signal and provide a third output signal for further processing based thereon;
   a fourth contact connected to the power supply, wherein the fourth contact is a junction between the substrate and the system in which the substrate is embedded or to which the substrate is electrically connected;
   a fourth compare unit connected to the fourth contact and to the second reference signal, and configured to compare a gradual change of a voltage at the fourth contact over time with the second reference signal and providing a fourth output signal for further processing based thereon; and
   a reference unit configured to provide the first reference signal and the second reference signal.

8. The circuitry according to claim 7, wherein the first contact and the second contact are connected to a first terminal of the power supply and the third contact and the fourth contact are connected to a second terminal of the power supply.

9. The circuitry according to claim 7, further comprising a memory configured to store at least one of the first output signal, the second output signal, the third output signal and the fourth output signal.

10. The circuitry according to claim 7, wherein the reference unit is an adjustable reference unit.

11. The circuitry according to claim 7, wherein the first to fourth compare units each comprise at least one of the following: an operational amplifier, a compare unit, and an analog-to-digital converter.

12. The circuitry according to claim 1, wherein the circuitry is at least one of the following: a substrate, a die, a chip, a module, a device, and a control unit.

13. The circuitry according to claim 1, further comprising a processing unit conducting the further processing, wherein the further processing comprises at least one of the following:
- issuing a notification,
- issuing an alarm,
- issuing a maintenance measure,
- changing a mode of the circuitry, and
- shutting down the circuitry or a portion thereof.

14. A method for monitoring a power supply of an electronic device comprising:
  (a) determining a comparison result by comparing a gradual change of a voltage at a first contact over time that is connected to the power supply with a first reference signal, wherein the first contact is a junction between the substrate and the system in which the substrate is embedded or to which the substrate is electrically connected;
  (b) monitoring the gradual change of the voltage at the first contact over time and determining whether the comparison result meets a predetermined condition, wherein the gradual change of the voltage is extrapolated based on a history of monitored voltage values; and
  (c) conducting a predefined action if the comparison result meets the predetermined condition.

15. The method according to claim 14, further comprising:
  (d) continuing with act (a) if the comparison result does not meet the predetermined condition.

16. The method according to claim 14, wherein the predetermined condition comprises at least one of the following:
- exceeding a predefined threshold;
- falling below a predefined threshold; and
- exceeding or falling short of a predefined threshold range.

17. The method according to claim 14, wherein the predefined action comprises at least one of the following:
- issuing a notification,
- issuing an alarm,
- issuing a maintenance measure,
- changing a mode of the circuitry, and
- shutting down the device or a portion thereof.

18. The method according to claim 14, wherein the predefined action comprises changing a monitoring mode.

19. The method according to claim 18, wherein the monitoring mode comprises at least one of the following parameters:
- a monitoring rate,
- a monitoring sensitivity, and
- an averaging parameter.

20. The method according to claim 19, wherein the monitoring rate indicates that monitoring is done in an iterative, regular, irregular, continuous or discontinuous way.

21. The method according to claim 14, wherein the first reference signal is supplied by at least one of the following:
- a reference unit,
- an adjustable reference unit,
- a shared reference potential, and
- a second contact, wherein the second contact is a junction between the substrate and the system in which the substrate is embedded or to which the substrate is electrically connected.

22. The method according to claim 14, wherein the method is run at least once during at least one of the following stages:
- during a manufacturing process of a semiconductor of the electronic device;
- during a manufacturing process of a semiconductor of the electronic device before or after a stress injection like a burn in;
- during operation of the electronic device;
- in regular or non-regular cycles during operation of the electronic device;
- during a system level test of the electronic device; and
- during a system level test as part of a power down sequence of the electronic device.

23. A method for monitoring a power supply of an electronic device, comprising:
- determining a first comparison result by comparing a gradual change of a voltage at a first contact over time that is connected to the power supply with a first reference signal, wherein the first contact is a junction between the substrate and the system in which the substrate is embedded or to which the substrate is electrically connected;
- determining a second comparison result by comparing a gradual change of a voltage at a second contact over time that is connected to the power supply with a second reference signal, wherein the second contact is a junction between the substrate and the system in which the substrate is embedded or to which the substrate is electrically connected;
- monitoring the gradual change of the voltage at the first contact and at the second contact over time and determining whether any of the first and second comparison results meets a predetermined condition, wherein the gradual change of the voltage is extrapolated based on a history of monitored voltage values; and
- conducting a predefined action if any of the first and second comparison results meets the predetermined condition.

24. The method according to claim 23, wherein the first reference signal and the second reference signal are identical.

25. The method according to claim 23, wherein the first reference signal and the second reference signal are provided by at least one of the following:
- a reference unit,
- an adjustable reference unit, and
- a shared reference potential.

26. The method according to claim 23, further comprising the following prior to monitoring the gradual change of the voltage:
- determining a third comparison result by comparing a voltage at a third contact that is connected to the power supply with a third reference signal, wherein the third contact is a junction between the substrate and the system in which the substrate is embedded or to which the substrate is electrically connected; and
- determining a forth comparison result by comparing a voltage at a fourth contact that is connected to the power supply with a fourth reference signal, wherein the fourth contact is a junction between the substrate and the system in which the substrate is embedded or to which the substrate is electrically connected.

27. The method according to claim 26, wherein the first contact and the second contact are connected to a first terminal of the power supply and the third contact and the fourth contact are connected to a second terminal of the power supply.

28. The method according to claim 26, wherein the third reference signal and the fourth reference signal are identical.

29. The method according to claim 26, wherein the third reference signal and the fourth reference signal are provided by at least one of the following:
   a reference unit,
   an adjustable reference unit, and
   a shared reference potential.

30. A system for monitoring a power supply of an electronic device, comprising:
   means for determining a comparison result by comparing a gradual change of a voltage at a first contact over time that is connected to the power supply with a first reference signal, wherein the first contact is a junction between the substrate and the system in which the substrate is embedded or to which the substrate is electrically connected, wherein the gradual change of the voltage is extrapolated based on a history of monitored voltage values;
   means for determining whether the comparison result meets a predetermined condition; and
   means for conducting a predefined action if the comparison result meets the predetermined condition.

31. The system according to claim 30, further comprising:
   means for continuing determining a subsequent comparison result if the comparison result does not meet the predetermined condition.

32. The method according to claim 30, wherein the first reference signal is provided by at least one of the following:
   a reference unit,
   an adjustable reference unit,
   a shared reference potential, and
   a second contact, wherein the second contact is a junction between the substrate and the system in which the substrate is embedded or to which the substrate is electrically connected.

\* \* \* \* \*